US010530373B1

(12) United States Patent
Fridi et al.

(10) Patent No.: US 10,530,373 B1
(45) Date of Patent: Jan. 7, 2020

(54) METHOD AND SYSTEM FOR GENERATING A SAW-TOOTH SIGNAL WITH FAST FLY BACK INTERVAL

(71) Applicant: GLOBALFOUNDRIES Inc., Grand Cayman (KY)

(72) Inventors: Ahmed Reda Fridi, Richardson, TX (US); Man Tran, Woodbridge (CA)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/428,975

(22) Filed: Jun. 1, 2019

(51) Int. Cl.
*H04B 1/38* (2015.01)
*H04B 1/06* (2006.01)
*H03L 7/099* (2006.01)
*H04B 1/40* (2015.01)
*H03K 4/08* (2006.01)
*H03L 7/093* (2006.01)

(52) U.S. Cl.
CPC ............. *H03L 7/0991* (2013.01); *H03K 4/08* (2013.01); *H03L 7/093* (2013.01); *H04B 1/40* (2013.01)

(58) Field of Classification Search
CPC ....... H03L 7/093; H03L 7/095; H03L 7/0991; H03L 7/0995; H03L 7/18; H03L 7/187; H03K 4/08; H04B 1/40; H04B 1/408
USPC .......... 455/73, 255, 258, 260, 265; 375/294, 375/324, 327, 376
See application file for complete search history.

(56) References Cited

U.S. PATENT DOCUMENTS

| | | | |
|---|---|---|---|
| 6,473,478 B1* | 10/2002 | Wallberg | H03L 7/091 375/376 |
| 6,504,437 B1 | 1/2003 | Nelson et al. | |
| 7,369,002 B2 | 5/2008 | Spijker et al. | |
| 7,388,440 B1 | 6/2008 | Giust et al. | |
| 8,476,945 B2* | 7/2013 | Elad | H03L 7/06 327/156 |
| 10,050,336 B2* | 8/2018 | Wang | H01Q 13/22 |
| 10,110,238 B2* | 10/2018 | Ek | H03L 7/1974 |
| 10,326,420 B1* | 6/2019 | Bellaouar | H03F 3/45269 |
| 10,355,646 B2* | 7/2019 | Lee | H04B 1/04 |

FOREIGN PATENT DOCUMENTS

GB 2547551 A 8/2017

\* cited by examiner

*Primary Examiner* — Quochien B Vuong
(74) *Attorney, Agent, or Firm* — Amerson Law Firm, PLLC

(57) ABSTRACT

A transceiver includes a frequency modulation continuous wave generator to generate a frequency sequence and a digital phase locked loop to generate a waveform based on the frequency sequence. The digital phase locked loop includes a plurality of control registers. A main controller captures a reference state defined in the plurality of configuration registers prior to the frequency sequence, initiates the frequency sequence, restores the reference state of the configuration registers after completion of the frequency sequence, and repeats the frequency sequence after restoring the reference state.

20 Claims, 3 Drawing Sheets

METHOD AND SYSTEM FOR GENERATING A SAW-TOOTH SIGNAL WITH FAST FLY BACK INTERVAL

BACKGROUND

Field of the Disclosure

Generally, the present disclosure relates to generating radio frequency signals and, in particular, to a method and system for generating a saw-tooth signal with fast fly back interval.

Description of the Related Art

Frequency Modulation Continuous Wave (FMCW) waveforms are employed in radar systems, such as millimeter-wave forward-looking systems for automotive use. For example, such radar systems may be employed for obstacle detection or autonomous intelligent cruise control applications. In a radar system, an increased demand for finer range and velocity resolution requires faster chirp sequences and larger FMCW bandwidth capability. Typically, chirp sequences are generated using a saw-tooth wave. The response time of the control loop for generating the chirp sequence affects the attainable sequence time and bandwidth.

The present disclosure is directed to various methods and resulting devices that may avoid, or at least reduce, the effects of one or more of the problems identified above.

SUMMARY

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

A transceiver includes, among other things, a frequency modulation continuous wave generator to generate a frequency sequence and a digital phase locked loop to generate a waveform based on the frequency sequence. The digital phase locked loop includes a plurality of control registers. A main controller captures a reference state defined in the plurality of configuration registers prior to the frequency sequence, initiates the frequency sequence, restores the reference state of the configuration registers after completion of the frequency sequence, and repeats the frequency sequence after restoring the reference state.

A system includes, among other things, a transmit antenna, a receive antenna, a frequency modulation continuous wave generator to generate a frequency sequence, and a digital phase locked loop to generate a transmit waveform on the transmit antenna based on the frequency sequence. The digital phase locked loop includes a plurality of control registers. A main controller is to capture a reference state defined in the plurality of configuration registers prior to the frequency sequence, initiate the frequency sequence to generate the transmit waveform, restore the reference state of the configuration registers after completion of the frequency sequence, and repeat the frequency sequence after restoring the reference state. A processing unit is to receive a reflection of the transmit waveform on the transmit antenna.

A method includes, among other things, generating a frequency sequence, providing the frequency sequence to a digital phase locked loop comprising a plurality of control registers to generate a transmit waveform, capturing a reference state defined in the plurality of configuration registers prior to the frequency sequence, initiating the frequency sequence, restoring the reference state of the configuration registers after completion of the frequency sequence, and repeating the frequency sequence after restoring the reference state.

BRIEF DESCRIPTION OF THE DRAWINGS

The disclosure may be understood by reference to the following description taken in conjunction with the accompanying drawings, in which like reference numerals identify like elements, and in which.

Figure 1:
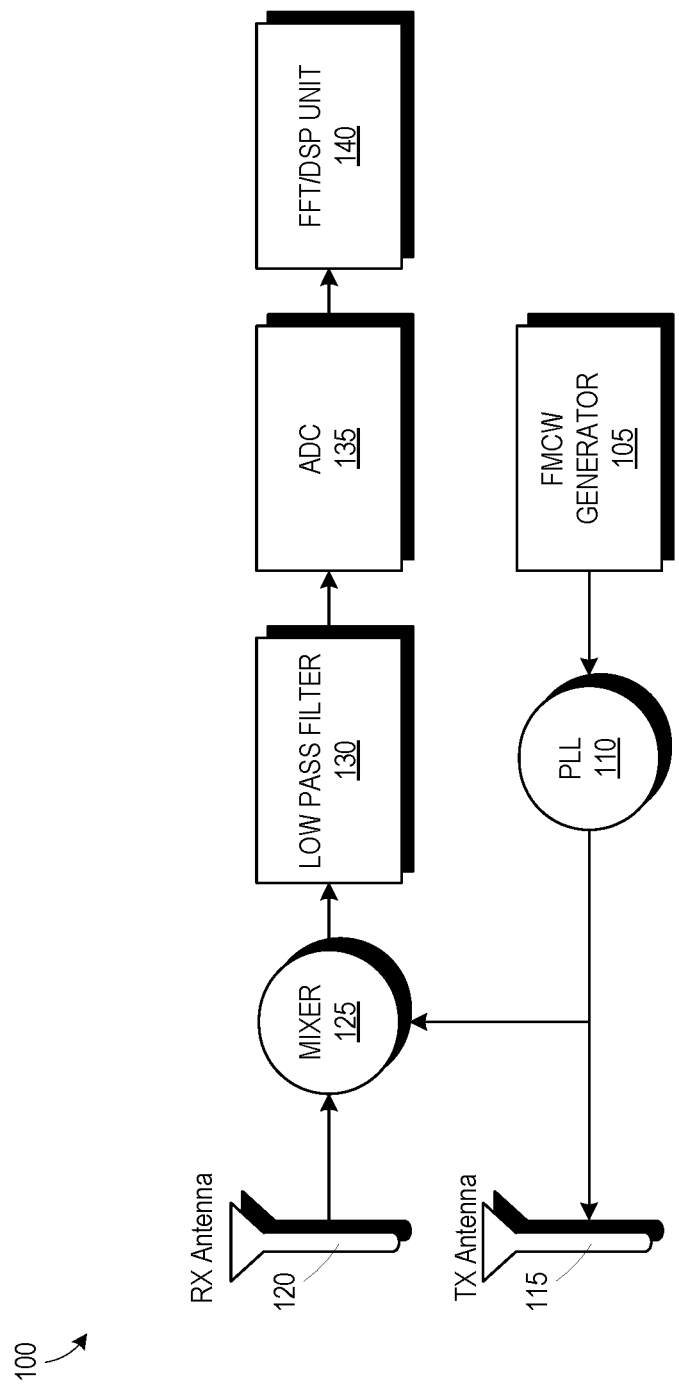
FIG. 1 is a block diagram of a transceiver, in accordance with some embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

FIG. 1 is a block diagram of a transceiver 100, in accordance with some embodiments. A transmit portion of the transceiver 100 includes a Frequency Modulation Continuous Wave (FMCW) generator 105 coupled to a Phase Locked Loop (PLL) 110. The PLL 110 is coupled to a transmit antenna 115. A receive portion of the transceiver 100 includes a receive antenna 120 coupled to a mixer 125, a low pass filter 130, an analog-to-digital converter (ADC) 135 and a Fast Fourier Transform/Digital Signal Processor (FFT/DSP) unit 140.

In general, the FMCW generator 105 defines parameters for a saw-tooth waveform that is provided to the phase locked loop 110 to generate a chirp sequence for transmission on the transmit antenna 115. The receive antenna 120 receives a reflection of the transmit waveform, presumably reflected from a target object. The reflection signal is mixed with the transmit signal in the mixer 125 to demodulate the signal, and the demodulated signal is provided to the low pass filter 130. The ADC 135 converts the filter receive signal to a digital signal, and the FFT/DSP unit 140 performs a FFT on the receive signal to generate a spectrum for the received signal and process the signal to identify characteristics of the target or targets reflecting the transmitted signal.

Figure 2:
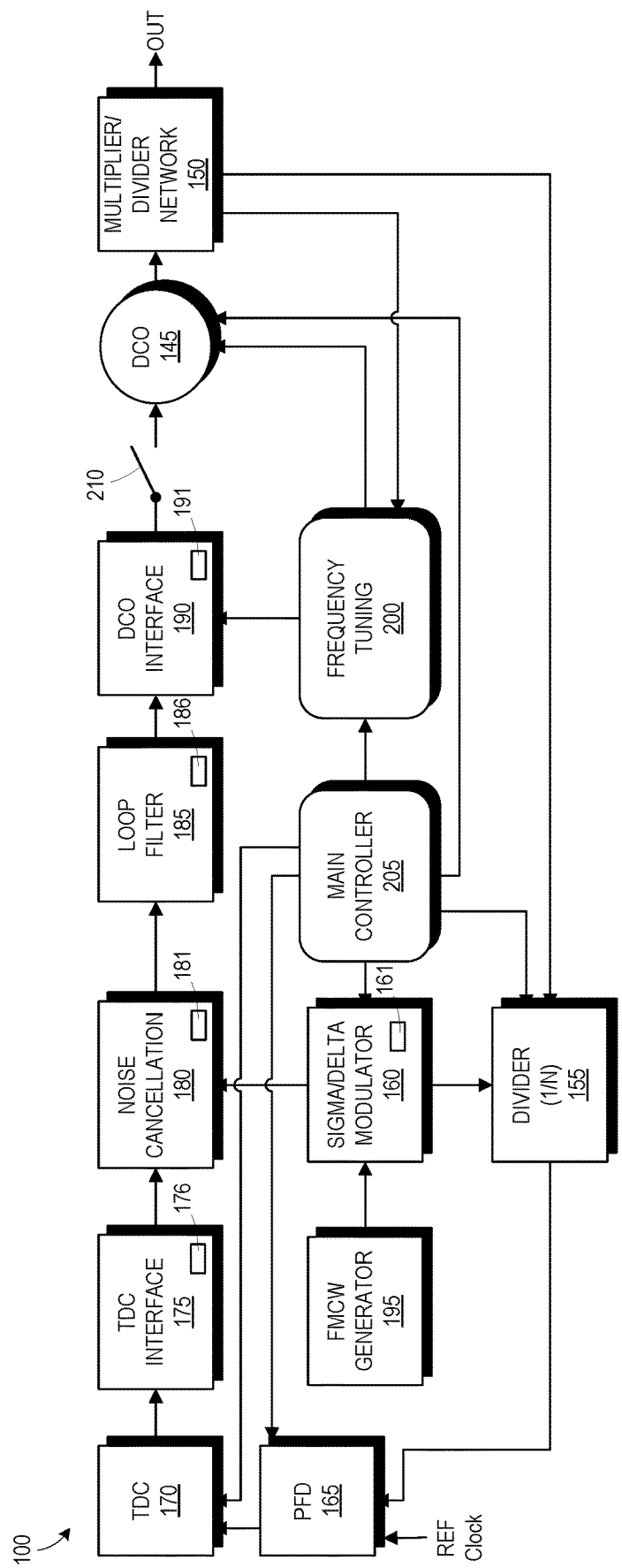
FIG. 2 is a block diagram of a digital phase locked loop (PLL) in the transceiver of FIG. 1, in accordance with some embodiments.

FIG. 2 is a block diagram of the PLL 110 in the transceiver 100 of FIG. 1, in accordance with some embodiments. The PLL 110 includes digitally controlled oscillator (DCO) 145 that generates an output signal for transmission on the transmit antenna 115. A multiplier/divider network 150 is connected to the DCO 145 to generate signals that are multiples or factors of the output frequency of the DCO 145. For example, if the output of the DCO 145 is 19 GHz, and the desired transmit frequency is in the 76-81 GHz rage, a multiplier in the multiplier/divider network 150 multiples the output of the DCO 145 by 4 to generate the output waveform. The multiplier/divider network 150 may divide the output signal of the DCO 145 by various factors for feedback control and phase error limiting.

An integer divider 155 receives the output of the DCO 145 and divides the output of the DCO 145 by a configurable integer factor, N, to generate a feedback signal. A sigma-delta modulator 160 generates cycle-to-cycle divider ratio values to configure the integer divider 155 and provide an average fractional value over time. A phase frequency detector (PFD) 165 receives the output of the integer divider 149 and detects the frequency or phase difference between the DCO 145 and a fixed reference clock and outputs a phase/frequency error pulse. A time-to-digital converter (TDC) 170 receives the output of the PFD 165 and converts the output error pulse from the PFD 165 into a digital value representing the duration or width of the error pulse. A TDC interface 175 formats the bits coming from the TDC 170. A noise cancellation unit 180 cancels quantization noise generated by the sigma-delta modulator 160. A loop filter 185 is a digital filter that defines the poles, zeros, and gains of the PLL 110. A DCO interface 190 formats the bits coming from the loop filter 185 into coarse and fine bits for controlling the oscillating frequency of the DCO 145. A FMCW generator 195 defines the parameters for the chirp sequence, such as the bandwidth and the ramp rate. The sigma-delta modulator 160 sets the demand frequency for the DCO 145 based on the ramp sequence defined by the FMCW generator 195.

A frequency tuning unit 200 is a state machine that tunes the DCO frequency in a coarse manner to a frequency close to the target lock frequency. A main controller 205 is a state machine that generates control and timing signals for the PLL 110. A switch 210 is provided to isolate the DCO 145 from the DCO interface 190, to open the control loop, as described in greater detail below. In some embodiments, the switch 210 is implemented using a multiplexer that connects the DCO interface 190 to the DCO 145 when closed and connects a default value to the DCO 145 when open. For example, the default value may be the output of the DCO interface 190 prior to beginning the frequency ramp (see point 320 described in reference to FIG. 3 below).

A state of the PLL 110 at a given time is defined by register values stored in configuration registers 161, 176, 181, 186, 191 of the sigma-delta modulator 160, the TDC interface 175, the noise cancellation unit 180, the loop filter 185, and the DCO interface 190, respectively.

Figure 3:
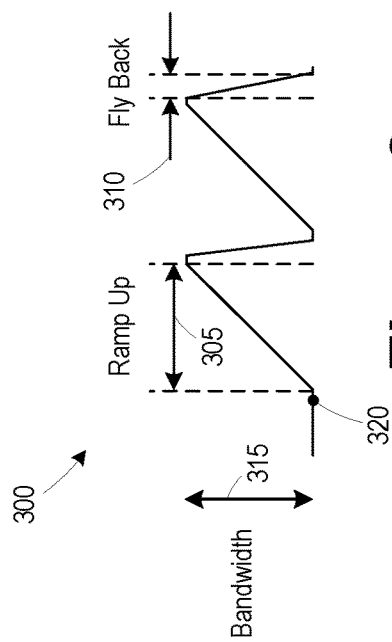
FIG. 3 is a diagram illustrating a chirp sequence used in the transceiver of FIG. 1, in accordance with some embodiments.

FIG. 3 is a diagram illustrating a chirp sequence 300 used in the transceiver of FIG. 1, in accordance with some embodiments. The chirp sequence 300 includes a ramp-up interval 305 and a fly-back interval 310. A bandwidth 315 represents the frequency range of the FMCW generator 195 defines the parameters of the chirp sequence. A reference point 320 is defined in the chirp sequence 300 just prior to the ramp-up interval 305.

Figure 4:
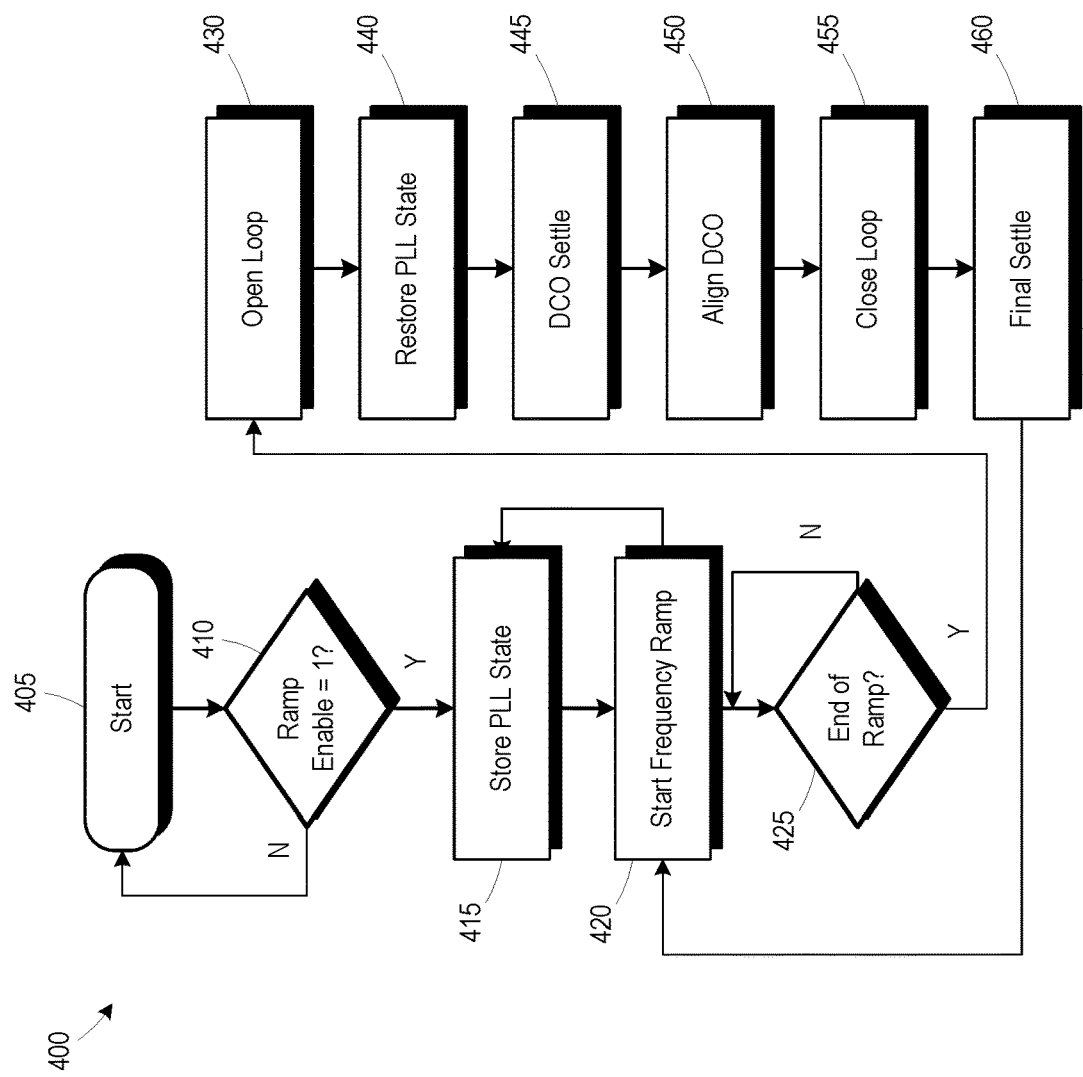
FIG. 4 is a flow diagram of a method for controlling the PLL of FIG. 2, in accordance with some embodiments.

FIG. 4 is a flow diagram of a method 400 for controlling the PLL 110 of FIG. 2, in accordance with some embodiments. The main controller 205 implements the method 400 for controlling the PLL 110 to implement the chirp sequence. The method 400 for controlling the chirp sequence starts in method block 405. In method block 410, the PLL 110 responds to a ramp enable logic signal. Upon assertion of the ramp enable signal in method block 410, the main controller 205 stores the state of the PLL 110 designated by point 320 in FIG. 3. The main controller 205 stores the states defined by the values in the configuration registers 161, 176, 181, 186, 191 of the sigma-delta modulator 160, the TDC interface 175, the noise cancellation unit 180, the loop filter 185, and the DCO interface 190, respectively.

In method block 420, the main controller 205 signals the FMCW generator 195 to initiate the frequency ramp. The end of the frequency ramp is detected in method block 425. After completion of the frequency ramp, the main controller 205 opens the control loop in method block 430 by opening the switch 215. In method block 440, the main controller 205 restores the state of the PLL 110 by writing the previously saved state back into the configuration registers 161, 176, 181, 186, 191 of the sigma-delta modulator 160, respectively, thereby restoring the PLL 110 to the reference point 320 prior to the ramp sequence.

In method block 445, the main controller 205 implements a delay interval to allow the DCO 145 to settle at the frequency value defined at the reference point 320. In method block 450, the phase of the DCO 145 is aligned to that of the REF clock. After the state of PLL 110 is restored in method block 440 and the frequency of the DCO 145 has settled in method block 445, the main controller 205 aligns the DCO 145 by resetting the integer divider 155 and aligns the phase of the output of the integer divider 155 to the phase of the REF clock at the input of the PFD 165 to less than a ¼ cycle of the output frequency of the multiplier/divider network 150.

In method block 455, the main controller 205 closes the switch 210 to close the control loop and reconnect the DCO interface 190 to the DCO 145. In method block 460, the main controller 205 implements a settle delay to allow any phase error between the DCO 145 and the REF clock to be corrected. The method 400 returns to method block 420 for the next ramp cycle.

A conventional approach to controlling the ramp sequence would be to implement a ramp-down of the frequency after the ramp-up interval to the frequency at the beginning of the ramp sequence and allow the PLL 110 to track the ramp-down. In contrast, by restoring the state in method block 400, the main controller 205 avoids the need to implement a ramp-down and allow the PLL 110 to track the ramp-down. The state restoration approach reduces the length of the fly-back interval 310 and avoids overshoot during the ramp-down that would require a guard band be implemented to mitigate the overshoot. As a result the available bandwidth 315 available for the frequency ramp is increased. In addition, the length of the fly-back interval 310 is the same regardless of the bandwidth 315 (i.e., frequency jump).

In some embodiments, the length of the ramp-up interval 305 is approximately 20 microseconds, and the length of the fly-back interval 310 is approximately 0.8 microseconds (i.e., as compared to a fly-back interval of about 5 microseconds for the conventional approach). As a result the fly-back interval 310 is about 4% of the sequence, as compared to 25%.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transceiver, comprising:
   a frequency modulation continuous wave generator to generate a frequency sequence;
   a digital phase locked loop to generate a waveform based on the frequency sequence, the digital phase locked loop comprising a plurality of control registers; and
   a main controller to capture a reference state defined in the plurality of configuration registers prior to the frequency sequence, initiate the frequency sequence, restore the reference state of the configuration registers after completion of the frequency sequence, and repeat the frequency sequence after restoring the reference state.

2. The transceiver of claim 1, wherein the digital phase locked loop comprises:
   a digitally controlled oscillator; and
   a modulator to generate a frequency input signal for the digitally controlled oscillator based on the frequency sequence, wherein the modulator includes a first one of the plurality of configuration registers.

3. The transceiver of claim 2, wherein the digital phase locked loop comprises:
   a phase frequency detector to generate an error signal responsive to a difference between an output of the digitally controller oscillator and a reference signal; and
   a loop filter to generate a demand signal for the digitally controlled oscillator based on the error signal and the frequency input signal, wherein the loop filter comprises a second one of the plurality of configuration registers.

4. The transceiver of claim 3, wherein the error signal comprises a pulse representing the difference between the output of the digitally controller oscillator and the reference signal, the digital phase locked loop comprises a time-to-digital converter to generate an error duration signal based on the pulse, and the time-to-digital converter includes a third configuration register of the plurality of configuration registers.

5. The transceiver of claim 3, further comprising a noise cancelation unit to receive the error signal and the frequency input signal and provide an input signal to the loop filter, wherein the noise cancellation unit includes a third configuration register of the plurality of configuration registers.

6. The transceiver of claim 1, wherein the main controller is to open a control loop of the digital phase locked loop prior to restoring the reference state of the configuration registers, and close the control loop of the digital phase locked loop after restoring the reference state of the configuration registers.

7. The transceiver of claim 6, wherein the main controller is to implement a first settling delay after restoring the reference state of the configuration registers and prior to closing the control loop.

8. The transceiver of claim 7, wherein the main controller is to implement a second settling delay after closing the control loop and prior to repeating the frequency sequence.

9. The transceiver of claim 1, wherein the frequency sequence comprises a frequency ramp.

10. A system, comprising:
    a transmit antenna;
    a frequency modulation continuous wave generator to generate a frequency sequence;
    a digital phase locked loop to generate a transmit waveform on the transmit antenna based on the frequency sequence, comprising:
      a plurality of control registers: and
      a main controller to capture a reference state defined in the plurality of configuration registers prior to the frequency sequence, initiate the frequency sequence to generate the transmit waveform, restore the reference state of the configuration registers after completion of the frequency sequence, and repeat the frequency sequence after restoring the reference state;
    a receive antenna; and
    a processing unit to receive a reflection of the transmit waveform on the receive antenna.

11. The system of claim 10, wherein the digital phase locked loop comprises:
    a digitally controlled oscillator;
    a modulator to generate a frequency input signal for the digitally controlled oscillator based on the frequency sequence, wherein the modulator includes a first one of the plurality of configuration registers;

a phase frequency detector to generate an error signal responsive to a difference between an output of the digitally controller oscillator and a reference signal; and a loop filter to generate a demand signal for the digitally controlled oscillator based on the error signal and the frequency input signal, wherein the loop filter comprises a second one of the plurality of configuration registers.

12. The system of claim 11, wherein the error signal comprises a pulse representing the difference between the output of the digitally controller oscillator and the reference signal, the digital phase locked loop comprises a time-to-digital converter to generate an error duration signal based on the pulse, and the time-to-digital converter includes a third configuration register of the plurality of configuration registers.

13. The system of claim 11, further comprising a noise cancelation unit to receive the error signal and the frequency input signal and provide an input signal to the loop filter, wherein the noise cancellation unit includes a third configuration register of the plurality of configuration registers.

14. The system of claim 10, wherein the main controller is to open a control loop of the digital phase locked loop prior to restoring the reference state of the configuration registers, and close the control loop of the digital phase locked loop after restoring the reference state of the configuration registers.

15. The system of claim 14, wherein the main controller is to implement a first settling delay after restoring the reference state of the configuration registers and prior to closing the control loop.

16. The system of claim 15, wherein the main controller is to implement a second settling delay after closing the control loop and prior to repeating the frequency sequence.

17. A method, comprising:
generating a frequency sequence;
providing the frequency sequence to a digital phase locked loop comprising a plurality of control registers to generate a transmit waveform;
capturing a reference state defined in the plurality of configuration registers prior to the frequency sequence;
initiating the frequency sequence;
restoring the reference state of the configuration registers after completion of the frequency sequence; and
repeating the frequency sequence after restoring the reference state.

18. The method of claim 17, further comprising:
opening a control loop of the digital phase locked loop prior to restoring the reference state of the configuration registers; and
closing the control loop of the digital phase locked loop after restoring the reference state of the configuration registers.

19. The method of claim 18, further comprising implementing a first settling delay after restoring the reference state of the configuration registers and prior to closing the control loop.

20. The method of claim 19, further comprising implementing a second settling delay after closing the control loop and prior to repeating the frequency sequence.

* * * * *